United States Patent
Zanchi et al.

(10) Patent No.: US 10,790,845 B1
(45) Date of Patent: Sep. 29, 2020

(54) CLOCKING CIRCUIT AND METHOD FOR TIME-INTERLEAVED ANALOG-TO-DIGITAL CONVERTERS

(71) Applicant: THE BOEING COMPANY, Chicago, IL (US)

(72) Inventors: Alfio Zanchi, Huntington Beach, CA (US); Rodney Kevin Bonebright, Bellevue, WA (US)

(73) Assignee: THE BOEING COMPANY, Chicago, IL (US)

( * ) Notice: Subject to any disclaimer, the term of this patent is extended or adjusted under 35 U.S.C. 154(b) by 0 days.

(21) Appl. No.: 16/427,922

(22) Filed: May 31, 2019

(51) Int. Cl.
*H03M 1/12* (2006.01)
*H03K 5/135* (2006.01)
*H03K 5/15* (2006.01)

(52) U.S. Cl.
CPC .......... *H03M 1/1215* (2013.01); *H03K 5/135* (2013.01); *H03K 5/15033* (2013.01)

(58) Field of Classification Search
None
See application file for complete search history.

(56) References Cited

U.S. PATENT DOCUMENTS

| | | | | |
|---|---|---|---|---|
| 7,015,842 B1* | 3/2006 | Gupta | ................. | G11C 27/024 341/122 |
| 2008/0158035 A1* | 7/2008 | Makabe | ................. | G06F 1/06 341/155 |
| 2011/0285568 A1* | 11/2011 | Harpe | ................. | H03M 1/56 341/158 |
| 2016/0079994 A1* | 3/2016 | Lee | ................. | H03M 1/002 341/118 |

OTHER PUBLICATIONS

Gao et al., A multi-phase clock design for super high-speed time interleaved analog-to-digital converter, Aug. 2012, IEEE, Published in: Anti-counterfeiting, Security, and Identification, Date of Conference: Aug. 24-26, 2012, Date Added to IEEE Xplore: Oct. 11, 2012, https://ieeexplore.ieee.org/document/632529.*
Janssen, E. et al. "An 11b 3.6 GS/s time-interleaved SAR ADC in 65nm CMOS" In 2013 IEEE International Solid-State Circuits Conference Digest of Technical Papers, pp. 464-465. IEEE, 2013.
(Continued)

*Primary Examiner* — Howard Williams
(74) *Attorney, Agent, or Firm* — Armstong Teasdale LLP (57) ABSTRACT

A time-interleaved analog-to-digital converter (ADC) includes a plurality of ADCs, an open-loop clocking circuit, and a time-multiplexing circuit. The plurality of ADCs receive an analog input signal. Each ADC is configured to sample the analog input signal upon receipt of a respective clock signal. The open-loop clocking circuit receives a main clock signal having a reference frequency, and then divides the main clock signal into a sequential plurality of respective clock signals, each having a frequency lower than the reference frequency, and each triggered by one other respective clock signal starting from the main clock signal. The open-loop clocking circuit then distributes the plurality of respective clock signals to the plurality of ADCs. The time-multiplexing circuit is coupled to the plurality of ADCs and is configured to combine respective digital output signals from the plurality of ADCs into a time series.

20 Claims, 8 Drawing Sheets

(56) References Cited

OTHER PUBLICATIONS

Miki, T. et al., "A 2GS/s 8b Time-Interleaved SAR ADC for Millimeter-Wave Pulsed Radar Baseband SoC," IEEE Asian Solid-State Circuits Conference, Nov. 7-9, 2016, Toyama, Japan, p. 5-8.

Stepanovic, D. et al., "A 2.8 GS/s 44.6 mW time-interleaved ADC achieving 50.9 dB SNDR and 3 dB effective resolution bandwidth of 1.5 GHz in 65 nm CMOS." IEEE Journal of Solid-State Circuits 48, No. 4 (2013): 971-982.

El-Chammas, M. et al., "A 12-GS/s 81-mW 5-bit time-interleaved flash ADC with background timing skew calibration." IEEE Journal of Solid-State Circuits 46, No. 4 (2011): 838-847.

Chen, W. et al., "Impact of VCO topology on SET induced frequency response." IEEE Transactions on Nuclear Science 54, No. 6 (2007): 2500-2505.

Iroaga, E. et al., "A background correction technique for timing errors in time-interleaved analog-to-digital converters." In 2005 IEEE International Symposium on Circuits and Systems, pp. 5557-5560. IEEE, 2005.

Li, J. et al., "A digital timing mismatch calibration technique in time-interleaved ADCs." IEEE Transactions on Circuits and Systems II: Express Briefs 61, No. 7 (2014): 486-490.

Hajimiri, A. et al., "A general theory of phase noise in electrical oscillators." IEEE journal of solid-state circuits 33, No. 2 (1998): 179-194.

Buchner, S. et al. "Single event transients in linear integrated circuits." (2005), 2005 IEEE Nuclear and Space Radiation Effects Conference. Seattle WA, Jun. 11, 2005, https://ntrs.nasa.gov/search.jsp?R=20050210087 2019-02-18T17:44:30+00:00Z.

Vaucher, C. et al., "A family of low-power truly modular programmable dividers in standard 0.35-/spl mu/m CMOS technology." IEEE Journal of Solid-State Circuits 35, No. 7 (2000): 1039-1045.

Song, J. et al., "A 10-b 800MS/s time-interleaved SAR ADC with fast timing-skew calibration." in 2016 IEEE Asian Solid-State Circuits Conference (A-SSCC), pp. 73-76. IEEE, 2016.

\* cited by examiner

CLOCKING CIRCUIT AND METHOD FOR TIME-INTERLEAVED ANALOG-TO-DIGITAL CONVERTERS

FIELD

The field of the disclosure relates generally to time-interleaved analog-to-digital converters, and more specifically to a clocking circuit and method for time-interleaved analog-to-digital converters.

BACKGROUND

Many electrical systems utilize time-interleaved analog-to-digital converters (ADCs) to achieve higher sampling rates without sacrificing resolution or power efficiency. A time-interleaved ADC generally includes an array of n-bit ADCs having a relatively slow sampling rate, where each ADC is "clocked" out of phase from the next ADC, i.e., interleaved in time, to produce an overall n-bit ADC with a faster sampling rate. Generally, the 360 degrees of phase corresponding to a clock signal period at the slower sampling rate are distributed among the array of ADCs, or ADC channels. With such a time-interleaved ADC, the analog signal being sampled is referred to as being "sliced" in time. The respective output n-bit digital signals, or words, of each ADC are then time-multiplexed into a single time-series of n-bit words, forming an aggregate output of the time-interleaved ADC.

Time-interleaved ADCs generally utilize various methods, such as least-mean-squares offset/gain/phase coefficient algorithms, to calibrate each ADC channel to reduce the occurrence of errors due to inter-channel offset, gain mismatch, or phase mismatch among ADCs. Such methods often use closed-loop circuits, such as a delay lock loop (DLL), phase lock loop (PLL), or both, to achieve a desired performance for the time-interleaved ADC by reducing phase error with respect to a common reference signal, for example, to align the time operation among the slices. Such closed-loop circuits are, in many implementations, susceptible to jitter and radiation events, such as a heavy-ion Single-Event Effect (SEE).

It is desirable to have a time-interleaved ADC that achieves high sampling rates and good resolution, and that is at least less susceptible to jitter and radiation events.

BRIEF DESCRIPTION

According to one aspect of the present disclosure, a time-interleaved analog-to-digital converter (ADC) is provided. The time-interleaved ADC includes a plurality of ADCs, an open-loop clocking circuit, and a time-multiplexing circuit. The plurality of ADCs receives an analog input signal. Each ADC is configured to sample the analog input signal upon receipt of a respective clock signal. The open-loop clocking circuit receives a main clock signal having a reference frequency, and then divides the main clock signal into a sequential plurality of respective clock signals, each having a frequency lower than the reference frequency, and each triggered by one other respective clock signal, of the plurality of respective clock signals, starting from the main clock signal. The open-loop clocking circuit then distributes the plurality of respective clock signals to the plurality of ADCs. The time-multiplexing circuit is coupled to the plurality of ADCs and is configured to combine respective digital output signals from the plurality of ADCs into a time series.

According to another aspect of the present disclosure, a clocking circuit for a time-interleaved ADC is provided. The clocking circuit includes a plurality of clock dividers arranged in a tree architecture having N levels. The plurality of clock dividers are configured to divide a received main clock signal, having a reference frequency, into a plurality, $2^N$ or $2\char`\^N$, of unique sequential phases having respective frequencies of $1/(2^N)$ of the reference frequency. The clocking circuit includes a master phase circuit configured to supply a plurality of master phase signals, based on the received clock signal, to the N levels of the plurality of clock dividers to align the plurality of unique sequential phases.

According to yet another aspect of the present disclosure, a method of clocking a time-interleaved ADC is provided. The method includes receiving a reference clock signal having a reference frequency. The method includes dividing the reference clock signal into a plurality of unique sequential phases, each having a lower-frequency. The method includes distributing the plurality of unique sequential phases to respective ADCs.

The features, functions, and advantages that have been discussed can be achieved independently in various embodiments or may be combined in yet other embodiments further details of which can be seen with reference to the following description and drawings.

DETAILED DESCRIPTION

As used herein, an element or step recited in the singular and preceded by the word "a" or "an" should be understood as not excluding plural elements or steps unless such exclusion is explicitly recited. Furthermore, references to "one embodiment" of the present invention or the "exemplary embodiment" are not intended to be interpreted as excluding the existence of additional embodiments that also incorporate the recited features.

Embodiments of the time-interleaved ADC, clocking circuit, and method described herein provide a time-interleaved ADC that utilizes an open-loop clocking circuit to calibrate, or align, the ADC slices. Such embodiments provide high sampling rates (i.e., speed), high conversion resolution, and are less susceptible to jitter and radiation events than known closed-loop alternatives. Embodiments of the open-loop clocking circuit include a hierarchical arrangement, or hierarchical tree architecture, of clock dividers to divide a higher-frequency clock into a plurality of unique sequential phases, each having a lower-frequency. Each clock divider is configured to divide a received clock signal into two phases having a frequency half that of the frequency of the received clock, and that are 180 degrees out of phase. The tree architecture includes one or more levels, N, such that the clocking circuit divides the higher-frequency, F, clock into $2^N$ unique sequential phases, where each terminal phase has a frequency of $F/(2^N)$. Time alignment of the unique sequential phases in each level of the tree architecture is achieved by a sequential logical dependency, enforced by the structure of the clocking circuit, among clock dividers within each given level, and propagates within the tree architecture to span multiple levels. Accordingly, while a closed-loop phase calibration algorithm may still be used to adjust time skews among phases at a very fine level, the structural sequence of the clock phases at each divided frequency is always enforced by the structure of the clocking circuit, is resistant to disruption by radiation events, and does not require a DLL circuit.

Conversely, in certain known alternative methods, using, for example, DLL-based closed-loop phase calibration, resolution may be sacrificed to achieve desired levels of stability of the DLL and/or speed of the time-interleaved ADC. In other known methods, speed of the time-interleaved ADC may be sacrificed to maintain its resolution and the stability of the DLL. Likewise, at least some conventional clocking circuits for time-interleaved ADCs utilize frequency multiplication or scaling that is substantially different and more complex. Such clocking circuits utilize a main clock having a lower frequency that is at or nearer to the operating frequency of the individual ADCs, as opposed to a higher-frequency main clock and frequency division in the embodiments of the time-interleaved ADC and clocking circuit described herein.

Figure 1:
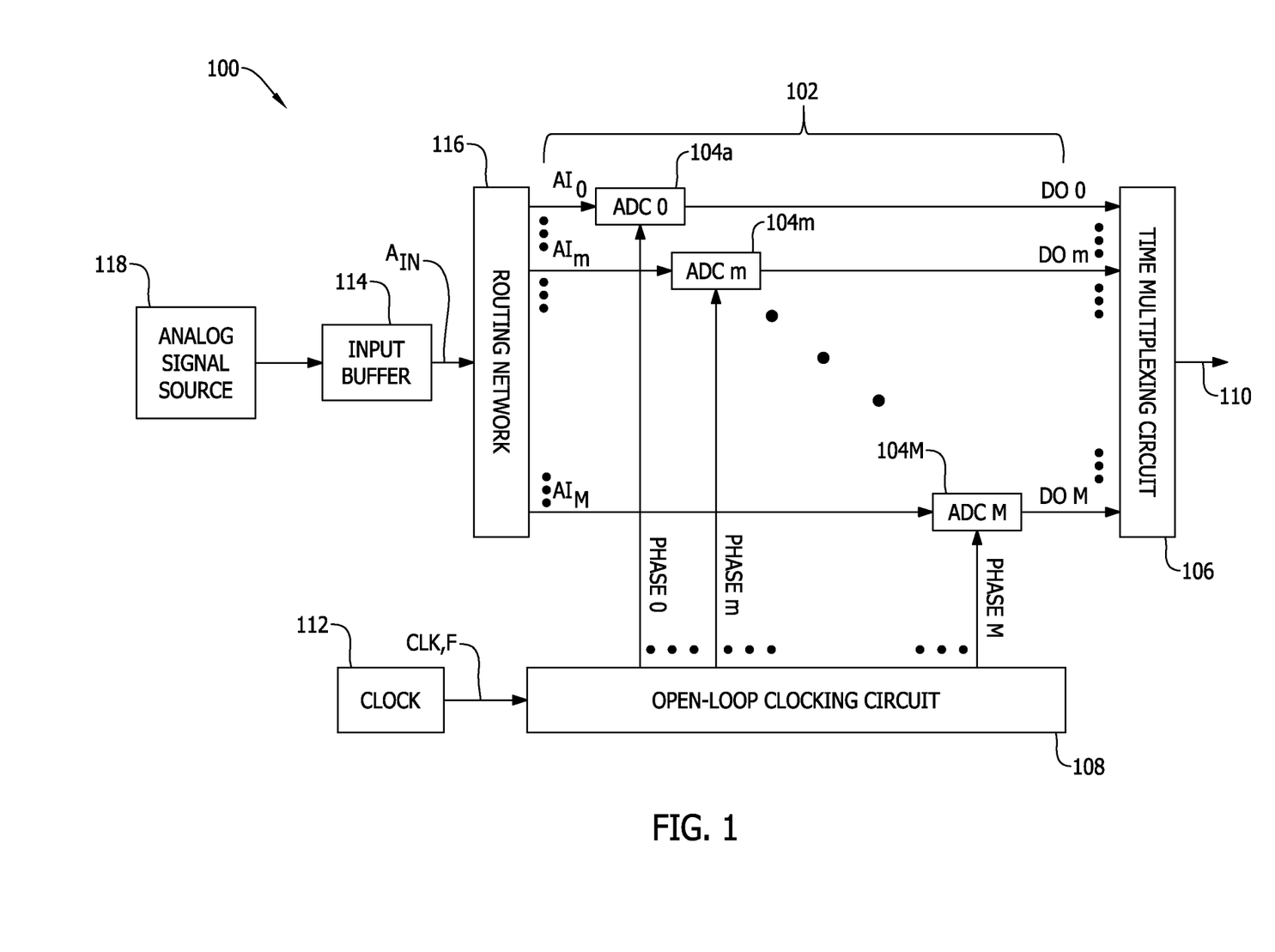
FIG. 1 is a schematic diagram of an example time-interleaved ADC.

FIG. 1 is a schematic diagram of a time-interleaved analog-to-digital converter (ADC) 100. Time-interleaved ADC 100 includes an array 102 of a plurality, M, of ADCs 104. Each ADC 104 (i.e., ADC 104a, . . . 104m, . . . 104M) is an n-bit ADC operable at a respective sampling frequency. Time-interleaved ADC 100 includes a time-multiplexing circuit 106 and an open-loop clocking circuit 108 that, in combination, perform the time-interleaving of respective samples acquired by ADCs 104. By time-interleaving ADCs 104, the over-all operating frequency, or reference frequency, F, of time-interleaved ADC 100 is increased over the respective sampling frequencies of ADCs 104. Generally, with M ADCs 104, the respective sampling frequency of ADCs 104 is F/M. For example, where the plurality of ADCs 104 includes 32 ADCs (i.e., M=32) having 12-bit resolution and a 200 MegaHertz (MHz) sampling frequency, time-interleaved ADC 100 would be operable with 12-bit resolution at 6.4 GigaHertz (GHz) (i.e., F=6.4 GHz).

Generally, ADCs 104a-104M each provide one digital output signal (DO), or "slice" (in time, or phase), of a time-multiplexed output signal, or a time series 110, produced by time-interleaved ADC 100. The respective slices of ADCs 104a-104M are precisely aligned in sequence to produce a high-quality time series 110. Known methods for such an alignment are generally embodied by calibration processes to reduce offset, gain, and phase error among the slices, at least some of which utilize post-processing techniques and/or closed-loop clocking circuits that may introduce noise, limit operating frequency, or are susceptible to radiation events. Open-loop clocking circuit 108, and time-interleaved ADC 100, as described herein, overcome these challenges.

Time-interleaved ADC 100 includes a main clock 112, or high-frequency clock synthesis circuit, that generates a main clock signal, CLK, having the over-all operating frequency, F. Main clock 112 provides main clock signal CLK to open-loop clocking circuit 108. In the prior example, main clock 112 would supply a 6.4 GHz main clock signal, CLK. In alternative embodiments, time-interleaved ADC 100 may omit main clock 112 and instead receives main clock signal CLK from an external source.

Time-interleaved ADC 100 includes an input buffer 114 and an analog routing network 116 for distributing an analog signal received from an analog signal source 118. Input buffer 114 may include, for example, one or more analog input buffer circuits including various passive and/or active components, such as, for example, op-amps, resistors, capacitors, inductors, or any other suitable components. Input buffer 114 is configured to condition the analog signal and output an analog input signal, $A_{IN}$, for distribution by analog routing network 116 and use by ADCs 104a-104M. For example, input buffer 114 may include filter circuits for reducing noise, and/or impedance networks to ensure signal matching and for regulating voltage biases. Input buffer 114 may also include op-amp circuits for regulating the output impedance seen by ADCs 104a-104M, e.g., presenting a high input impedance to the external ADC drivers and a lower output impedance to routing network 116, resulting in minimal distortion of the analog input signal $AI_0$-$AI_M$ received at each of ADCs 104a-104M. Analog signal source 118 is an external source such as, for example, an antenna, transceiver, or demodulator. In alternative embodiments, however, time-interleaved ADC 100 and analog signal source 118 may be integrated into a single integrated circuit or device. Analog routing network 116 distributes $A_{IN}$ to each of ADCs 104a-104M. ADCs 104a-104M are clocked sequentially, i.e., out of phase, by open-loop clocking circuit 108 to capture the respective slices of $AI_0$-$AI_M$ that are then recombined by time-multiplexing circuit 106. Accordingly, open-loop clocking circuit 108 supplies a plurality, M, of unique sequential phases of main clock signal, CLK, each of which has a frequency of F/M and is out of phase from the next.

Figure 2:
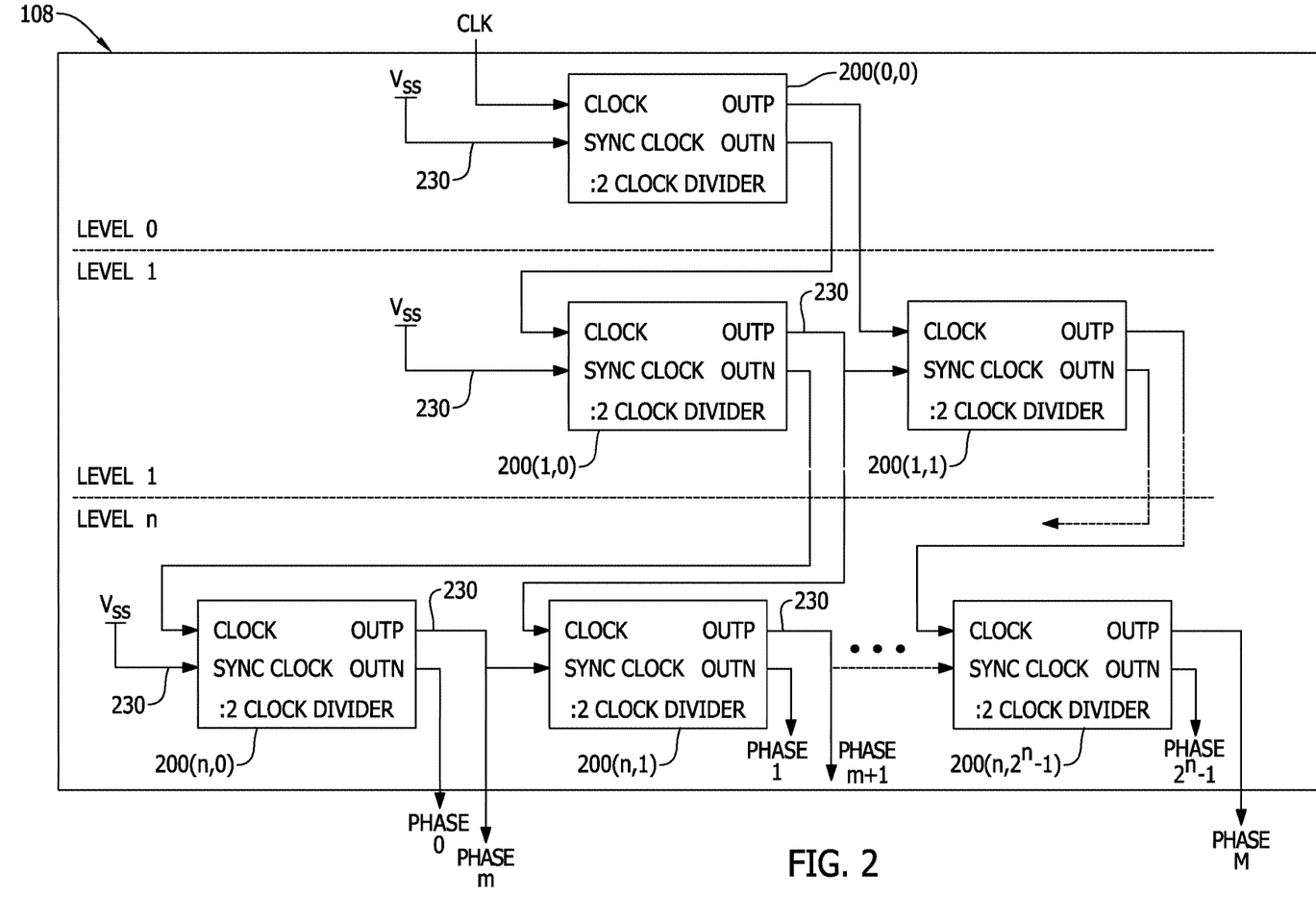
FIG. 2 is a schematic diagram of an example open-loop clocking circuit for use in the time-interleaved ADC shown in FIG. 1.

FIG. 2 is a schematic diagram of one embodiment of open-loop clocking circuit 108 shown in FIG. 1. Open-loop clocking circuit 108 includes a plurality of clock dividers 200 arranged in a tree architecture, or hierarchically. Generally, for the purpose of illustrating the time-interleaved ADC, the clocking circuit, and the method described herein, the tree architecture of open-loop clocking circuit 108 includes multiple, N, levels (e.g., level 0, 1, 2, etc.) of clock dividers 200; where each level is "higher" or "lower" than, or "above" or "below," the next. For example, level 0 is higher than level 1, and level 1 is higher than level 2, and, likewise, level 2 is lower than levels 0 and 1, and level 1 is lower than level 0. Further, within a given level, clock dividers are arranged in sequential "stages," where each stage either precedes or follows the next. For example, in open-loop clocking circuit 108 shown in FIG. 2, level 0 is the highest level and includes a single stage, i.e., clock divider 200(0,0). Level 1, for example, includes two stages: clock divider 200(1,0) and clock divider 200(1,1), where clock divider 200(1,0) precedes clock divider 200(1,1). Likewise, clock divider 200(0,0) is above both clock dividers 200(1,0) and 200(1,1) in the tree architecture of open-loop clocking circuit 108.

Clock dividers 200 (also referred to as "by two" or ":2" clock dividers) each divide a respective input clock signal (CLOCK) into two output clock signals having a frequency that is half the frequency of the input clock (CLOCK), and that are complementary, or 180 degrees out of phase. The output clock signals are referred to as the positive and negative output signals, or phases (OUTP and OUTN), each of which (e.g., OUTN) is supplied to respective clock dividers 200 in a next-lower level as an input clock signal (CLOCK). The positive and negative output signals, or phases (OUTP and OUTN) of a lowest level, e.g., the nth level, serve as the unique phases generated by open-loop clocking circuit 108, e.g., phase 0 through phase M shown in FIG. 1, that are supplied to respective ADCs 104a-104M. For example, the negative output phase (OUTN) of clock divider 200(0-0) in level 0 is supplied as a clock signal to clock divider 200(1,0) and the positive output phase (OUTP) is supplied as a clock signal to clock divider (1,1) in level 1. Accordingly, clock dividers 200 effectively divide the frequency of the input clock signal. For example, if the main clock signal (CLK) has a frequency of 6.4 GHz, each of the output phases of level 0 (OUTP and OUTN) has a frequency of 3.2 GHz and is 180 degrees out of phase from the other. The quantity of levels (N) of clock dividers 200 in open-loop clocking circuit 108 defines the quantity of unique sequential phases generated, i.e., $2^N$. As illustrated in FIG. 2, there could be any number of levels between level 1 and level n, i.e., the lowest level. For clarity, only a portion of the N levels and $2^n$ stages are shown. In the above example having 32 ADCs 104, open-loop clocking circuit 108 would include 5 levels (i.e., N=5) of clock dividers 200. Each clock divider 200 on the lowest level (e.g., the nth level, where n=4) generates two of the plurality of unique sequential phases, each 180 degrees out of phase from the other. Further, each level, n, includes $2^n$ clock dividers 200. For example, a first level (n=0) includes $2^n$ (one) clock divider 200, and a fifth level (n=4) includes $2^4$ (sixteen) clock dividers that generate $2^5$ (thirty two) unique sequential phases.

Clock dividers 200 each receive a master phase, or "SYNC CLOCK," signal that gates a latching of the clock states for the output phases. Within a given level of the tree architecture, a master phase circuit 230 supplies a master phase clock state (phase 0) based on main clock signal CLK. The master phase clock state (phase 0) may be set, for example, by a fixed logical voltage level, e.g., Vss. The master phase clock state is supplied to one clock divider 200 within the level to trigger a "cascade," or sequential daisy-chain of master phase signals (SYNC CLOCK) that are distributed by master phase circuit 230 and enable triggering of each clock divider within the level. The ultimate sequencing of the phases is independent of which of clock dividers 200 in a given level receives the master phase clock state (phase 0), because the cascade, or daisy-chain, through the master phase circuit 230 architecture still provides a logical dependency from one phase to the next. For example, in open-loop clocking circuit 108, level 1, a master phase clock state (Vss) is supplied to clock divider 200(1,0) as its SYNC CLOCK signal, and it cascades to clock divider 200(1,1) via the OUTP output of clock divider 200(1,0) and master phase circuit 230. In other words, the clock states of clock divider 200(1,1) do not latch until after the clock states of clock divider 200(1,0) are latched, which is enabled by, or slaved to, the master phase clock state. Accordingly, by its architecture, open-loop clocking circuit 108 aligns its output phases in a sequential manner, beginning with phase 0. Moreover, because the master phase clock state is initially seeded by a fixed state, or a fixed logic-level voltage (Vss), at every level any errors potentially occurring in the phase order among the unique sequential phases (e.g., phase 0 to phase M) can propagate only within a single latching cycle through clock dividers 200. In other words, in the lowest, or last, level of open-loop clocking circuit 108 driving time-interleaved ADC 100, an error can only last at most for one revolution cycle of the $2^N$ phases of the time-multiplexed output clock signal, before the "hard-wired" seed state (phase 0) of the master phase state signal restores the correct phase order.

Because open-loop clocking circuit 108 operates based directly on the main clock signal CLK, and not based on a cascade of phases derived, e.g., by phase division using a DLL, open-loop clocking circuit 108 provides each slice with a clock phase of great precision, affected by very low noise, and with little susceptibility to error propagation, compounding, instability, and sample corruption experienced in at least some alternative closed-loop schemes. Open-loop clocking circuit 108, advantageously, prevents any one error in phase of the plurality of unique sequential phases from propagating and/or compounding beyond a single cycle, or revolution, through clock dividers 200 in the tree architecture. Moreover, the relative stability of open-loop clocking circuit 108, when compared to at least some alternative closed-loop schemes, makes open-loop clocking circuit 108 less susceptible to radiation events that can upset one or more of the unique sequential phases, because such an upset is resolved in no more than $2^N$ clock cycles of the main clock signal CLK.

Open-loop clocking circuit 108 shown in FIG. 2 is illustrated having three levels. In other embodiments, open-loop clocking circuit 108 may have one or more level, which would generate two or more unique sequential phases. At a lowest level of open-loop clocking circuit 108, the plurality of unique sequential phases produced is then distributed to ADCs 104a-104M.

Figure 3:
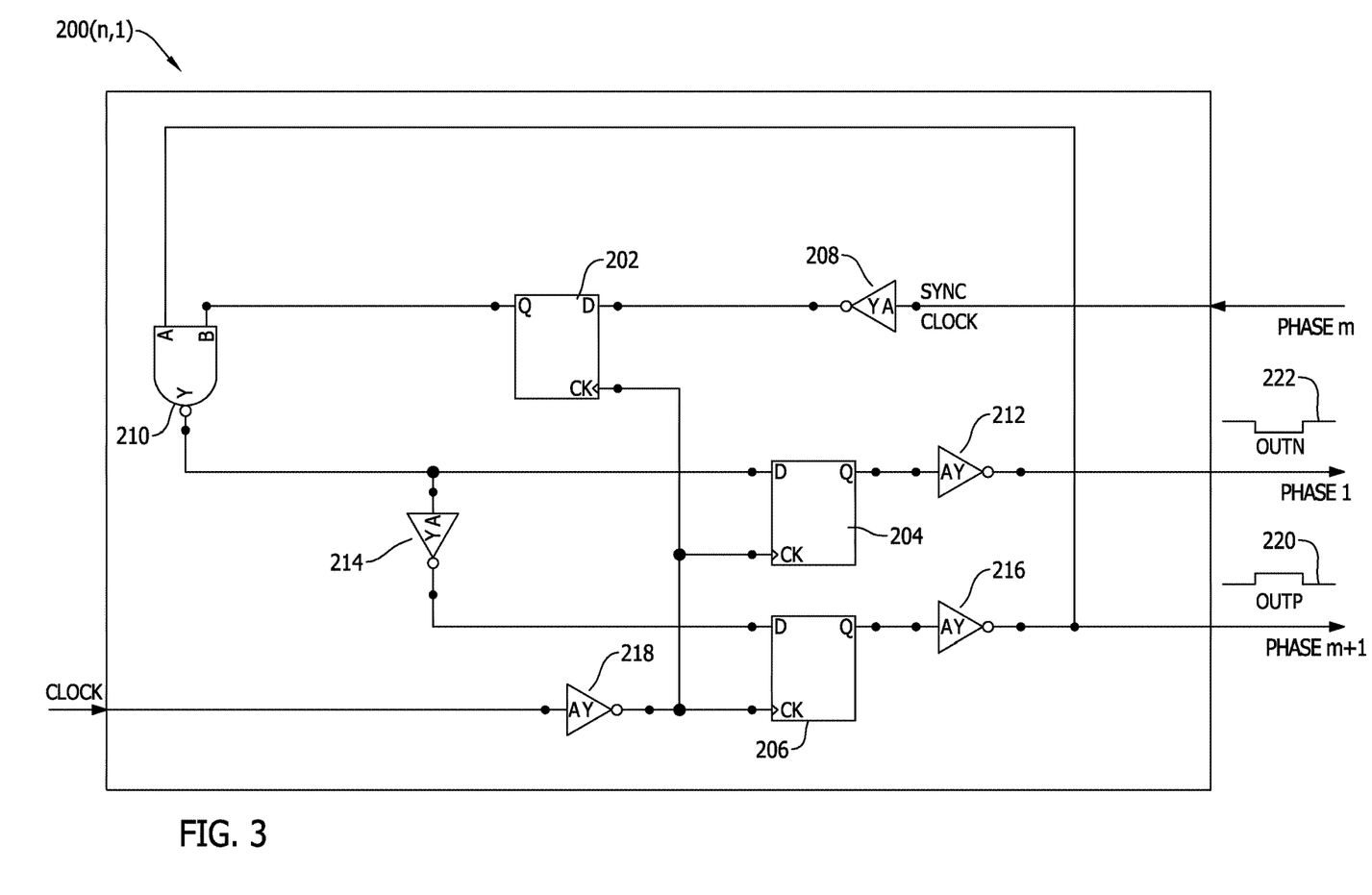
FIG. 3 is a schematic diagram of an example clock divider for use in the open-loop clocking circuit shown in FIGS. 1 and 2.

FIG. 3 is a schematic diagram of clock divider 200(n,1) shown in FIG. 2 for use in open-loop clocking circuit 108. Each other clock divider 200 may be implemented identically to clock divider 200(n,1). Clock divider 200(n,1) includes various logic circuit components configured, or arranged or wired logically, in combination to receive an input clock signal (CLOCK) and a master phase state signal (SYNC CLOCK) (e.g., phase m from the previous stage), and to generate two output phases (OUTP and OUTN, or phase 1 and phase m+1). Clock divider 200(n,1) includes a first D-type flip flop (D-FF) 202, a second D-FF 204, and a third D-FF 206. The master phase state signal (SYNC CLOCK) is provided to first D-FF 202 via an inverter 208. Clock divider 200(n,1) includes a primary clocking branch, or chain of circuits, through a conditional inverter 210, an inverter 214, third D-FF 206, and an inverter 216 looping back, or feeding back, to conditional inverter 210 one of the two output phases, e.g., OUTP. The primary clocking branch produces a first divided clock signal 220 at OUTP. Clock divider 200(n,1) includes a complementary clocking branch through conditional inverter 210, second D-FF 204, and an inverter 212. The complementary clocking branch produces a second divided clock signal 222 at OUTN that is 180 degrees out of phase from the first divided clock signal, and at the same frequency of the first divided clock signal.

First D-FF 202 latches a clocking logic-level state, e.g., logic-level high voltage from the master phase state signal (SYNC CLOCK). Second and third D-FFs 204 and 206 latch opposite clock states. Each of first, second, and third D-FFs 202, 204, and 206 latch upon a clock edge provided by the clock input signal (CLOCK) through an inverter 218. As described above with respect to open-loop clocking circuit 108 shown in FIG. 2, the input clocking signal for a given stage, or clock divider, is supplied by a clock divider output phase of an above level. Further, clock divider 200(n,1) is configured to feed back its first divided clock signal 220, or OUTP, to conditional inverter 210. Conditional inverter 210 is configured to close a triple-inversion loop (including conditional inverter 210, inverter 214, third D-FF 206, and inverter 216) that functions to toggle the state of third D-FF 206, unless the logic level latched at first D-FF 202 is logic-level low, or zero. When first D-FF 202 is latched at logic-level low, the state of the SYNC CLOCK signal is logic-level high, or one, corresponding, in this embodiment, to the master phase state not being ready. As described above with respect to open-loop clocking circuit 108 shown in FIG. 2, the SYNC CLOCK signal for a given stage, or clock divider, is supplied by a preceding clock divider output phase. Conditional inverter 210 functions as a third inverter in the primary branch, as described above, when triggering is enabled by the preceding clock divider output phase. Accordingly, by having disparity in their number of inverters, the primary and complementary clocking branches in the architecture of clock dividers 200 allows any two output phases in immediate sequence to have opposite logic levels. For example, if clock divider 200(n-0) latches a logic-level low at its OUTN, clock divider 200(n-1) can be configured to latch a logic-level high at its OUTN.

Figure 4:
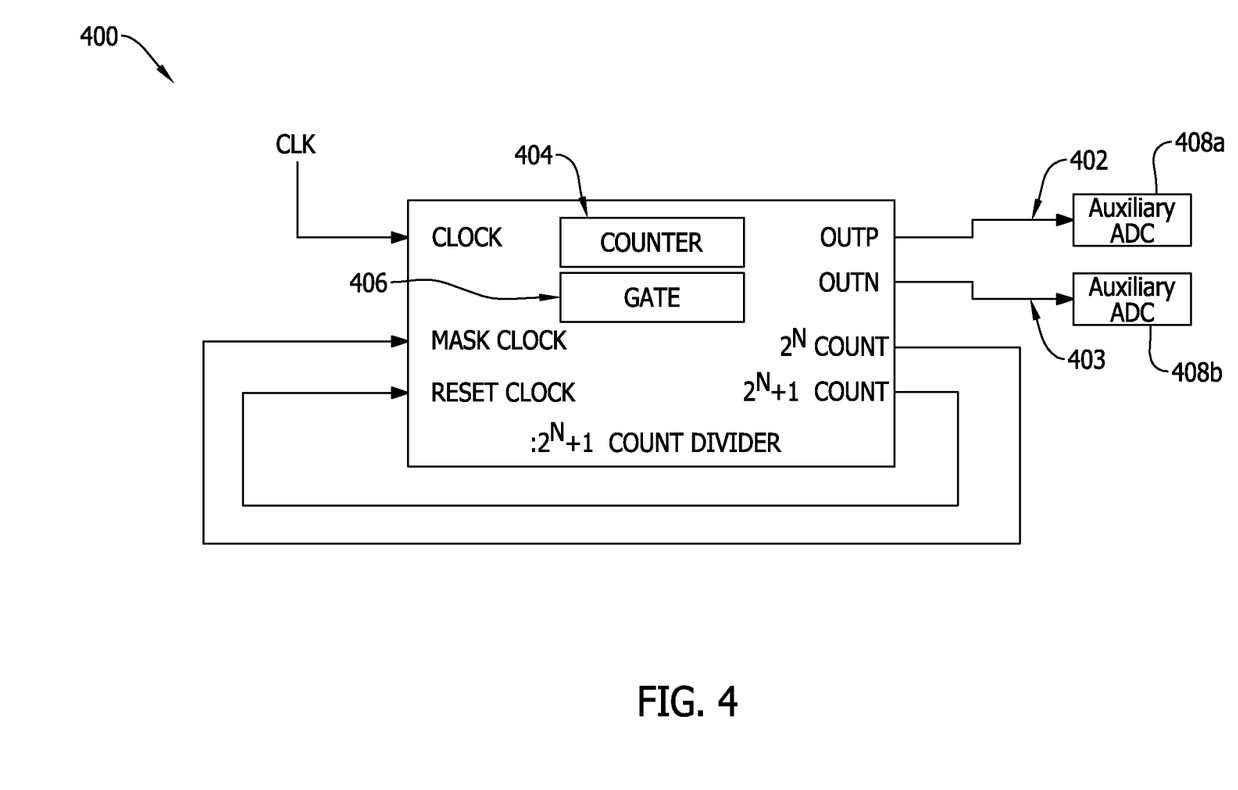
FIG. 4 is a schematic diagram of an example auxiliary clock divider circuit.

FIG. 4 is a schematic diagram of an example auxiliary clock divider 400, sometimes referred to as an "$2^N+1$" clock divider, for use with open-loop clocking circuit 108 shown in FIGS. 1 and 2 to drive one or more auxiliary calibration ADCs 408a and 408b. In certain embodiments, one or more auxiliary slice, or reference slice, is generated by ADCs 408a and, in certain embodiments, ADC 408b for use in a background calibration process. Such a background calibration process generally operates in the digital domain based on the digital time series output from time multiplexing circuit 106. In certain alternative embodiments, the background calibration process may be combined with, for example, a DLL to carry out phase calibration in the analog domain. Auxiliary clock divider 400 generates auxiliary clock phases 402 and 403 having a frequency value divided, with respect to the main clock signal CLK, by one more than open-loop clocking circuit 108. For example, if open-loop clocking circuit 108 divides the main clock signal CLK by 32 (i.e., $2^5$), auxiliary clock divider 400 divides the signal by 32+1, or 33, which allows a slower revolution of, e.g., the auxiliary clock phase 402, and periodically aligning auxiliary clock phase 402 with each of the unique sequential phases (phases 0 through M) generated by open-loop clocking circuit 108. Auxiliary clock divider 400 includes a counter 404, or counter circuit, that counts clock cycles of the main clock signal CLK, and a gate 406. For a given level, n, gate 406 triggers an additional clock phase, or, for example, auxiliary clock phase 402 edge, and resets counter 404 when counter 404 reaches a reset value, for example, the quantity of clock dividers 200 within the given level of open-loop clocking circuit 108 plus one, or $2^N+1$. For example, for a fifth level (i.e., N=5), counter 404 resets when it reaches a count of 32 ($2^5$). Gate 406 functions to mask all clock edges until counter 404 latches its reset value. Because auxiliary clock divider 400 operates based directly on the main clock signal CLK, and not on a phase derived, e.g., by way of frequency multiplication and scaling using a PLL, open-loop clocking circuit 108 and auxiliary clock divider 400 are able to provide auxiliary clock phases 402 and 403, or auxiliary slices, having a clock phase with great precision and affected by very low noise.

Figure 5:
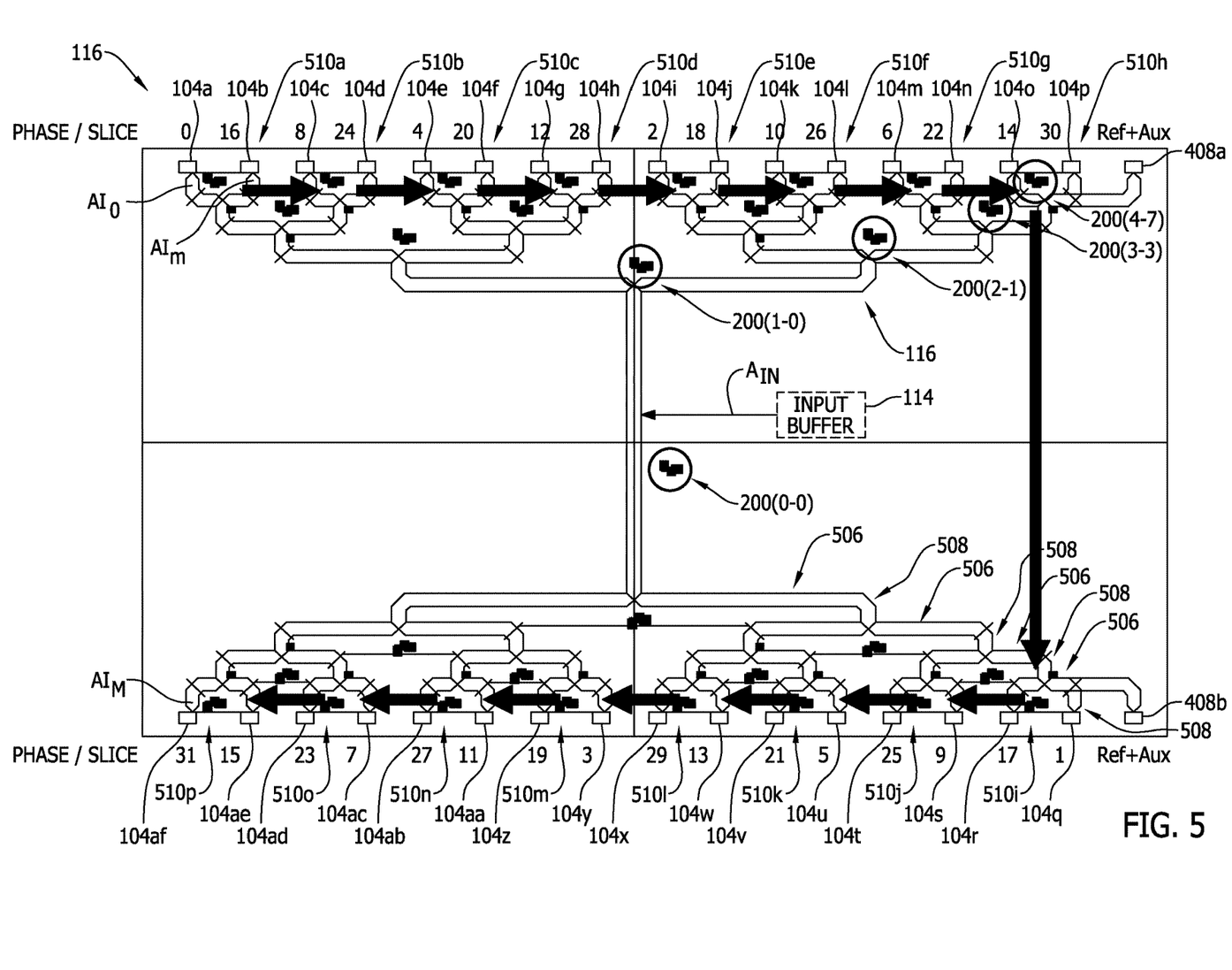
FIG. 5 is a schematic diagram of an example routing network for an analog input signal and a plurality of unique sequential phases for clocking ADCs.

FIG. 5 is a schematic diagram of analog routing network 116 for an analog input signal, $A_{IN}$, and a plurality of unique sequential phases (phase 0 through phase M) for clocking ADCs 104a-104M. Analog routing network 116 as shown in FIG. 5, is for use in an embodiment where analog signal source 118 is an RF source. In alternative embodiments, analog routing network 116 may include a layout of conductive traces for lower frequency analog signals, or in other embodiments, for higher frequency analog signals. A clock routing network (not shown) for distributing the unique sequential phases to respective ADCs 104a-104M utilizes a similar architecture to route divided clock signals from each level of clock dividers in the tree architecture to each next level and, ultimately, to each of ADCs 104a-104M.

Figure 6:
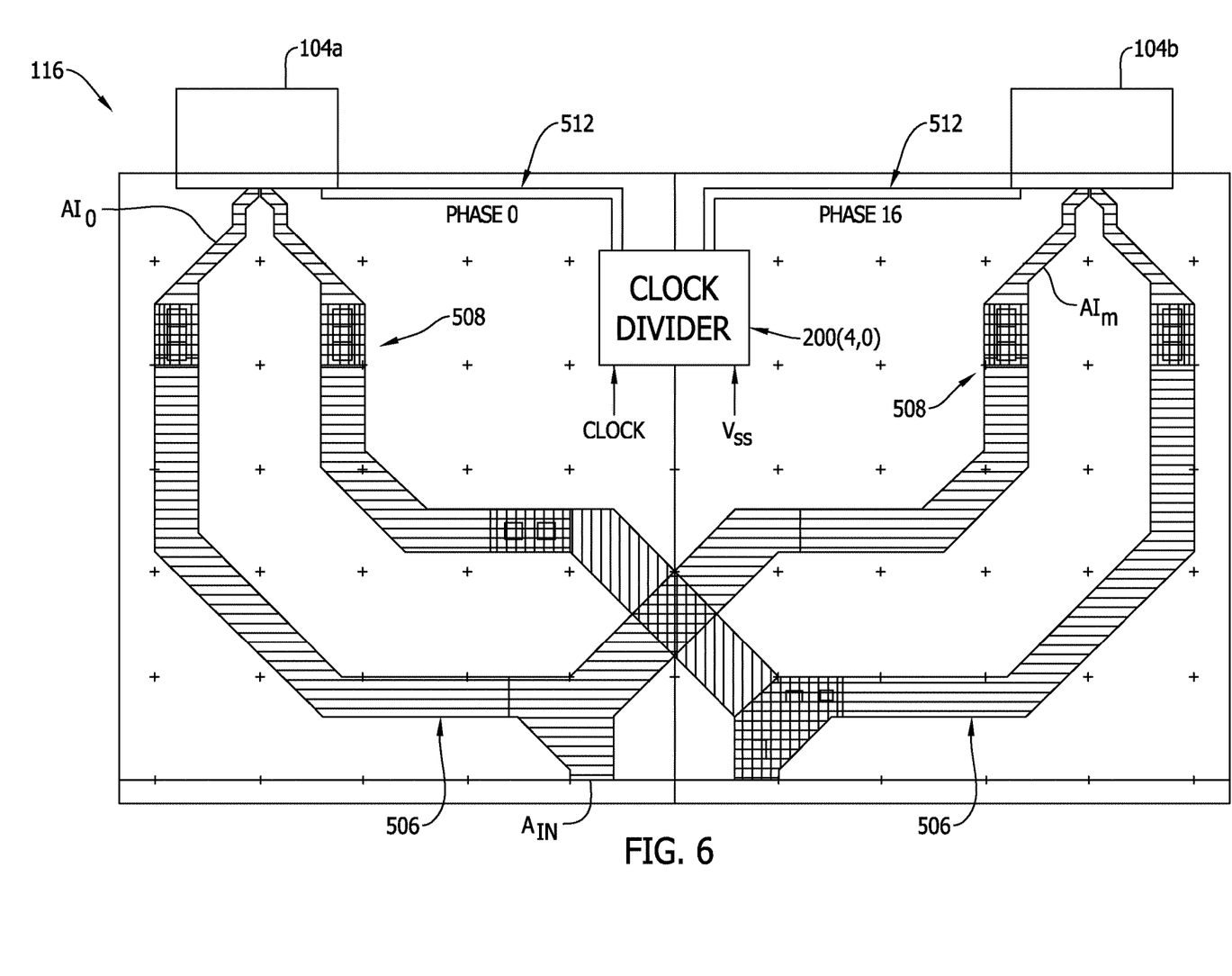
FIG. 6 is detailed schematic diagram of one portion of the routing network shown in FIG. 5.

Analog routing network 116 receives the analog input signal, $A_{IN}$, from input buffer 114. Analog routing network 116 includes a plurality of branches 506 of RF traces, arranged in a tree architecture, for supplying the analog input signal, $A_{IN}$, in parallel, to each ADC 104, e.g., ADC 104a-104M, in the form of analog inputs $AI_0$-$AI_M$, each of which originates as $A_{IN}$. Each branch 506 terminates in a stub 508 that either divides again or terminally couples to a respective one of ADCs 104a-104M. FIG. 6 is a more detailed schematic diagram of analog routing network 116, including branches 506 and stubs 508 of analog routing network 116 at the terminations for an adjacent ADC pair 510a. FIG. 6 illustrates two branches 506 each terminating at respective stubs 508 such that ADCs 104a and 104b of adjacent ADC pair 510a may be coupled to analog routing network 116. ADC 104a is coupled to analog routing network 116 to receive $AI_0$, and ADC 104b is coupled to analog routing network 116 to receive $AI_m$. FIG. 6 further illustrates clock divider 200(4,0) providing two phases, e.g, phase 0 and phase 16, on respective clock branches 512 of the clock routing network for supplying the two phases to ADCs 104a and 104b of adjacent ADC pair 510a. In certain embodiments, the clock routing network includes an additional branch 512 for one or more auxiliary calibration ADCs, e.g., auxiliary ADCs 408a and 408b shown in FIG. 4, that may be driven, for example, by auxiliary clock phases 402 and 403 generated by auxiliary clock divider 400, also shown in FIG. 4.

Analog routing network 116 and open-loop clocking circuit 108 are configured, in combination, to operate ADCs 104a-104M such that, for a given local, or adjacent, pair of the plurality of ADCs 104, while one ADC 104 is sampling (i.e., in sample mode, or its clock state is logic-level high), its neighbor ADC 104 is holding (i.e., in hold mode, or its clock state is logic-level low). For example, as shown in FIG. 6, when ADC 104a is sampling, ADC 104b is holding. Accordingly, the loading of the branch of analog routing network 116 and input buffer 114 supplying the analog input signal, $A_{IN}$, to the given adjacent ADC pair 510 is maintained relatively steady, resulting in reduced distortion at the input of ADCs 104a-104M and at the output of input buffer 114. Moreover, of the plurality of ADCs 104 in array 102, during operation, half will be sampling and the other half will be holding, resulting in an overall steady loading of both analog routing network 116 and input buffer 114.

Analog routing network 116, shown in FIG. 5, illustrates various adjacent ADC pairs 510a-510p and their position in the sequence of phases, or slices (e.g., 0-31). As illustrated by the block-arrows indicating, the sequence flows left-to-right at the top of analog routing network 116 and right-to-left at the bottom of analog routing network 116. FIG. 5 further illustrates the tree architecture of open-loop clocking circuit 108. Each level is indicated by one circled clock divider 200 within that level. For example, a top level clock divider 200(0-0) is positioned at center of analog routing network 116. The clock routing network (not shown) then branches to a next-lower level clock divider 200(1-0), then clock divider 200(2-1), clock divider 200(3-3), and clock divider 200(4-7). The master clock phases identified within open-loop clocking circuit 108 may be flexibly arranged to sequence the terminal clock phases in, for example, level 4 of the tree architecture to follow the ADC slice order of 0-16-8-24-4-20, etc., indicated by arrows shown in FIG. 5, thereby reducing the master phases' routing and improving the clock speed of open-loop clocking circuit 108.

Figure 7:
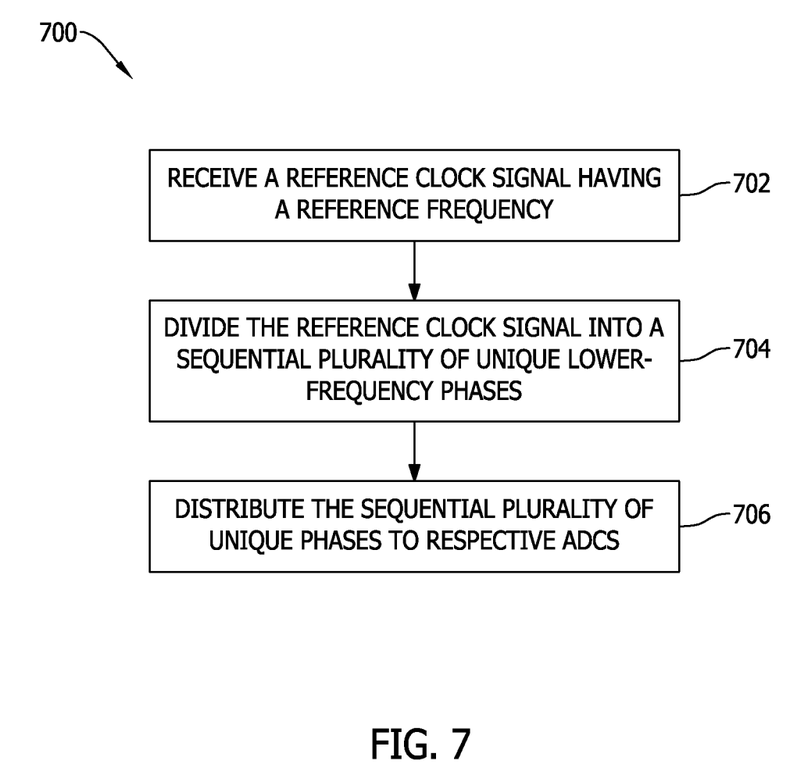
FIG. 7 is a flow diagram of an example method of clocking a time-interleaved ADC.

FIG. 7 is a flow diagram of an example method 700 of clocking a time-interleaved ADC. With reference to time-interleaved ADC 100 and open-loop clocking circuit 108 shown in FIGS. 1 and 2, method 700 includes receiving 702 a reference clock signal, such as main clock signal CLK at open-loop clocking circuit 108. The reference clock signal CLK has a reference frequency that defines the overall operating frequency, F, of ADC 100. The reference clock signal may originate, for example, from clock 112.

Open-loop clocking circuit 108 divides 704 the reference clock signal into a plurality of unique sequential phases, e.g., phase 0 to phase M, each having a lower frequency than the reference clock signal frequency, F. The plurality of unique sequential phases can be logically inverted to generate a second plurality of unique sequential phases, where each is 180 degrees out of phase from a respective one of the (first) plurality of unique sequential phases. The division 704 of the reference clock signal is carried out by a plurality of clock dividers 200 arranged in a tree architecture, or hierarchically. The tree architecture includes N levels to generate $2^N$ phases in the plurality of unique sequential phases. The reference clock signal cascades through clock dividers 200 in an open-loop manner, latching a clock state for a unique sequential phase upon detecting a divided clock signal edge from a next-higher level of the N levels, and conditionally to the state of a preceding clock phase at a same level. The sequencing of the plurality of unique sequential phases is achieved by a cascade of master phases within open-loop clocking circuit 108 that generates a sequence of clock states, based on the reference clock signal and a "hard-wired" initial master clock state supplied to one of the stages, clock dividers 200, of open-loop clocking circuit 108. The master phase clock states align the plurality of unique sequential phases by gating the cascade of triggers through the tree architecture of clock dividers 200. The plurality of unique sequential phases are then distributed 706 to respective ADCs 104*a*-104M.

Figure 8:
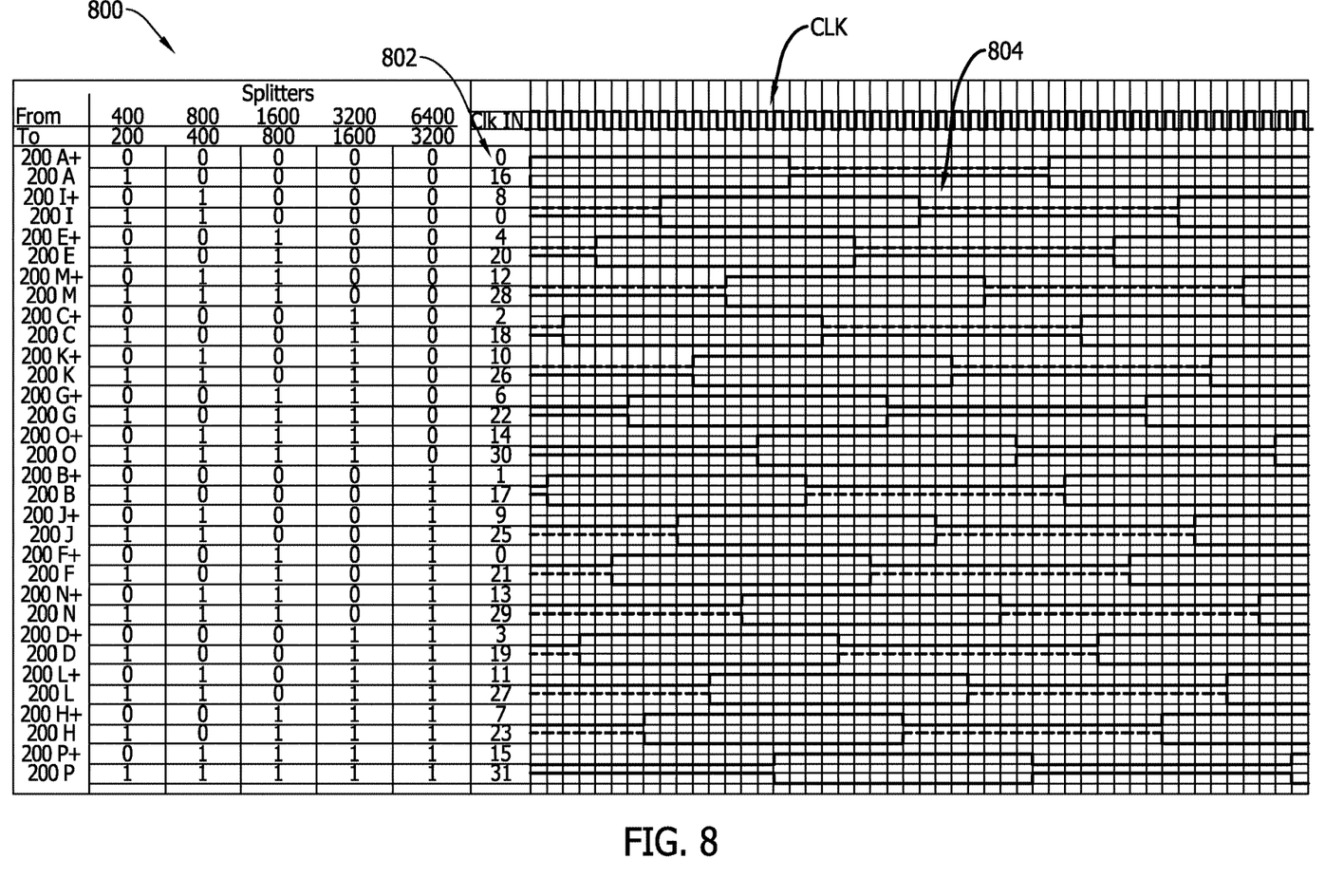
FIG. 8 is a timing diagram of an example plurality of unique sequential phases.

FIG. 8 is a timing diagram 800 of an example plurality of unique sequential phases 802 generated, for example, by open-loop clocking circuit 108. The plurality of unique sequential phases 802 are identified by their phase or slice number (e.g., 0-31), and are grouped in their respective adjacent ADC pairs 510*a*-*p*. For example, the first adjacent ADC pair 510*a* includes phases 0 and 16, which are 180 degrees out of phase with each other, as illustrated by their respective phase traces 804 and indicated in FIG. 5. Phase traces 804 further illustrate their proportionally low frequency when compared to the reference clock signal, or main clock signal CLK.

An exemplary technical effect of the methods, systems, and apparatus described herein includes at least one of: (a) improving radiation hardening of time-interleaved ADC; (b) reducing jitter in clocking circuit for time-interleaved ADC; (c) providing an open-loop clocking circuit for a time-interleaved ADC; (d) broadening the range of operating frequency for time-interleaved ADCs by eliminating closed-loop circuits subject to frequency tuning and stabilizing; (e) maintaining high dynamic-range (e.g., 12-bit nominal resolution) without introducing distortion, noise, or other errors stemming from the analog input sampling by time-interleaved clock phases, in the time-multiplexed digital output; (f) reducing complexity of clocking circuits for time-interleaved ADCs by reducing or eliminating close-loop tuning circuits, delay lines, calibration algorithms, and digital post-processing.

The systems and methods described herein are not limited to the specific embodiments described herein, but rather, components of the systems and/or steps of the methods may be utilized independently and separately from other components and/or steps described herein.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to disclose various embodiments, which include the best mode, to enable persons skilled in the art to practice those embodiments, including making and using any devices or systems and performing any incorporated methods. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A time-interleaved analog-to-digital converter (ADC), comprising:
    a plurality of ADCs configured to receive an analog input signal, each ADC configured to sample the analog input signal upon receipt of a respective clock signal;
    an open-loop clocking circuit comprising a plurality of clock dividers arranged in a tree architecture, wherein the open-loop clocking circuit is configured to receive a main clock signal having a reference frequency, the open-loop clocking circuit further configured to:
        divide the main clock signal into a sequential plurality of respective clock signals, each having a frequency lower than the reference frequency, and each triggered by one other respective clock signal, of the sequential plurality of respective clock signals, starting from the main clock signal, and
        distribute the sequential plurality of respective clock signals to the plurality of ADCs; and
    a time-multiplexing circuit coupled to the plurality of ADCs and configured to combine respective digital output signals from the plurality of ADCs into a time series.

2. The time-interleaved ADC of claim 1 further comprising an input buffer through which the analog input signal passes before arriving at the plurality of ADCs.

3. The time-interleaved ADC of claim 1 further comprising a high-frequency clock synthesis circuit configured to generate the main clock signal at the reference frequency.

4. The time-interleaved ADC of claim 1 further comprising a routing network configured to distribute the analog input signal to the plurality of ADCs.

5. The time-interleaved ADC of claim 4, wherein the plurality of ADCs are arranged in adjacent pairs on respective stubs of the routing network.

6. The time-interleaved ADC of claim 5, wherein, for each adjacent pair of the plurality of ADCs, the sequential plurality of respective clock signals are offset in phase to operate a first ADC in a sample mode, and a second ADC in a hold mode at any instant in time.

7. A clocking circuit for a time-interleaved analog-to-digital converter (ADC), comprising:
 a plurality of clock dividers arranged in a tree architecture having N levels, the plurality of clock dividers configured to divide a received main clock signal, having a reference frequency, into a plurality, 2^N, of unique sequential phases having respective frequencies of 1/(2^N) of the reference frequency; and
 a master phase circuit configured to supply a plurality of master phase signals, based on the received clock signal, to the N levels of the plurality of clock dividers to align the plurality of unique sequential phases.

8. The clocking circuit of claim 7, wherein each clock divider in an nth level is latched only after its preceding clock divider is latched.

9. The clocking circuit of claim 7, wherein the plurality of master phase signals is organized in a sequential daisy-chain that triggers each clock divider within an n-th level of the plurality of clock dividers.

10. The clocking circuit of claim 7, wherein each clock divider comprises:
 a primary clocking branch configured to generate a first divided clock signal; and
 a complementary clocking branch configured to generate a second divided clock signal 180 degrees out of phase from the first divided clock signal.

11. The clocking circuit of claim 7, wherein each clock divider comprises:
 a first D-type flip-flop circuit (D-FF) configured to latch a clocking logic-level voltage;
 a second D-FF and a third D-FF configured to latch opposite clock states; and
 a chain of circuits configured to invert a clock state conditionally based on a state of a preceding clock phase at a same level in the tree architecture.

12. The clocking circuit of claim 11, wherein each clock divider further comprises:
 a first inverter coupled to a data line of the first D-FF and configured to invert the clocking logic-level voltage of the clock state latched in the first D-FF; and
 a second inverter coupled to an output line of the second D-FF and configured to invert the clocking logic-level voltage of the clock state latched in the second D-FF.

13. The clocking circuit of claim 11, wherein the first D-FF and the second D-FF of each clock divider is clocked by an output clock signal from a clock divider in a next higher level in the tree architecture.

14. The clocking circuit of claim 7 further comprising a counter circuit configured to generate an additional clock phase after counting (2^N)+1 cycles of the received main clock signal.

15. A method of clocking a time-interleaved analog-to-digital converter (ADC), the method comprising:
 receiving, at a clocking circuit, a reference clock signal having a reference frequency;
 dividing, by a plurality of clock dividers of the clocking circuit arranged in a tree architecture, the reference clock signal into a plurality of unique sequential phases, each having a lower-frequency, and each triggered by one other of the plurality of unique sequential phases; and
 distributing the plurality of unique sequential phases to respective ADCs.

16. The method of claim 15 further comprising inverting the plurality of unique sequential phases to generate a second plurality of unique sequential phases each 180 degrees out of phase from a respective one of the plurality of unique sequential phases.

17. The method of claim 15, wherein dividing the reference clock signal comprises cascading, in an open loop, the reference clock signal through the plurality of clock dividers arranged in the hierarchical tree architecture having N levels to generate the plurality, 2^N, of unique sequential phases.

18. The method of claim 17, wherein cascading the reference clock signal through a clock divider comprises latching a clock state for a unique sequential phase upon detecting a divided clock signal edge from a next-higher level of the N levels, and conditionally to the state of a preceding clock phase at a same level.

19. The method of claim 18, wherein latching the clock state for the unique lower-frequency phase comprises:
 inverting a clocking logic-level voltage; and
 latching an inverted clocking logic-level voltage in a first D-type flip-flop (D-FF) upon receiving the divided clock signal edge from the next-higher level.

20. The method of claim 15 further comprising generating a plurality of master phase signals, based on the reference clock signal, to align the plurality of unique sequential phases.

\* \* \* \* \*